(12) United States Patent  
Shimosaka et al.

(10) Patent No.: US 7,077,905 B2  
(45) Date of Patent: Jul. 18, 2006

(54) APPARATUS FOR PULLING A SINGLE CRYSTAL

(75) Inventors: Makoto Shimosaka, Kanagawa Prefecture (JP); Sunao Abe, Kanagawa Prefecture (JP)

(73) Assignee: Toshiba Ceramics Co., Ltd., Tokyo (JP)

( * ) Notice: Subject to any disclaimer, the term of this patent is extended or adjusted under 35 U.S.C. 154(b) by 6 days.

(21) Appl. No.: 10/633,487

(22) Filed: Aug. 4, 2003

(65) Prior Publication Data

US 2005/0257736 A1     Nov. 24, 2005

(30) Foreign Application Priority Data

Sep. 13, 2002 (JP) .............................. 2002-268249

(51) Int. Cl.  
*C30B 15/14* (2006.01)

(52) U.S. Cl. ........................... 117/217; 117/30; 117/35; 117/218

(58) Field of Classification Search .................. 117/30, 117/35, 217, 218  
See application file for complete search history.

(56) References Cited

U.S. PATENT DOCUMENTS

| 6,036,776 | A  | * | 3/2000  | Kotooka et al. | ............. 117/217 |
| 6,153,008 | A  | * | 11/2000 | Von Ammon et al. | ........ 117/13 |
| 6,197,111 | B1 | * | 3/2001  | Ferry et al. | .................. 117/217 |
| 6,409,833 | B1 | * | 6/2002  | Park | .......................... 117/217 |
| 6,527,859 | B1 | * | 3/2003  | Lee et al. | .................... 117/217 |
| 6,821,344 | B1 | * | 11/2004 | Park | .......................... 117/217 |

FOREIGN PATENT DOCUMENTS

| JP | 5-884 A     | 1/1993 |
| JP | 2000-119089 A | 4/2000 |

* cited by examiner

*Primary Examiner*—Robert Kunemund  
(74) *Attorney, Agent, or Firm*—Foley & Lardner LLP

(57) ABSTRACT

An apparatus for pulling the single crystal has a radiation shield. The apparatus can improve the ratio of single crystallization, even if the radiation shield is made of graphite base material and covered with silicon carbide. The apparatus can be manufactured by low cost and can improve heat insulating characteristic. The apparatus does not generate cracks by heat stress even in a large size. In the apparatus for Czochralski method having the radiation shield, the radiation shield is formed of graphite base material covered with silicon carbide. An inside corner of a curvature formed on the base material is formed of a curved surface.

12 Claims, 5 Drawing Sheets

APPARATUS FOR PULLING A SINGLE CRYSTAL

This application claims priority from Japanese Patent Application 2002-268249, filed Sep. 13, 2002, which is incorporated herein by reference in their entirety.

TECHNICAL FIELD OF THE INVENTION

This invention relates to an apparatus for pulling a single crystal, particularly an apparatus including a radiation shield improved.

RELATED ART

Generally, a silicon single crystal is mainly used for a substrate of a semiconductor device. Such silicon single crystal is made from polycrystalline silicon according to Czochralski method (CZ method hereinafter).

As shown in FIG. 8, an apparatus 21 for pulling a semiconductor single crystal used for CZ method comprises a chamber means 22, a quartz glass crucible 23, and a heater 24. The quartz glass crucible 23 is located inside the chamber means 22. The heater 24 is arranged so as to surround the quartz glass crucible 23. Material poly-silicon is filled in the quartz glass crucible 23, and heated and melted by the heater 24. After a seed crystal 26 attached to a seed chuck 25 is immersed in a silicon melt M, the seed chuck 25 is pulled to grow a single crystal Ig as rotating the seed chuck 25 and the quartz glass crucible 23.

In this process of pulling the single crystal according to CZ method, silicon oxides evaporate and float from the silicon melt M as a result of reaction of the quartz glass crucible 23 and the silicon melt M. Because such silicon oxides largely influence on a ratio of single crystallization for the growing silicon single crystal Ig, they need to be discharged efficiently out of the chamber means 22.

For that purpose, a radiation shield 27 is arranged above the quartz glass crucible 23 so as to surround the growing silicon single crystal Ig. The radiation shield 27 shields radiation heat radiating on the silicon single crystal Ig from the heater 24 and the melt M for promoting cooling the silicon single crystal Ig, in order to increase a temperature gradient that influences on a speed of pulling the single crystal. Further, the radiation shield 27 has a function of controlling gas flow, in which inert gas G introduced from a hole 28 flows from a circumference of the silicon single crystal Ig, via the middle and periphery of the quartz glass crucible 23 to holes 30. Here the hole 28 is provided at an upper part of the chamber means 22 for supplying inert gas, whereas the holes 30 are provided at a bottom 29 of the chamber means 22 for discharging inert gas. Thus, the ratio of single crystallization is improved by discharging silicon oxides generated from the silicon melt M or metal vapor generated from a graphite crucible 31 etc., which are gases for inhibiting single crystallization.

Further, a clean atmosphere is maintained by forming the radiation shield 27 of a graphite base material and coating a surface of the graphite base material with silicon carbide etc.

With a recent large sizing of silicon single crystal, the radiation shield 27 also becomes large. Therefore, improvement of the effect of shielding radiation heat, which is one of the objects of the prior art, causes increasing the temperature difference of the radiation shield 27 in itself. Thereby heat stress increases in the radiation shield 27.

Therefore, as noted above, if the surface of the radiation shield made of graphite base material is coated with silicon carbide, heat stress between both these materials causes compression and expansion, due to the difference between the characteristics of graphite base material and silicon carbide. If these are beyond strength characteristic of graphite material, there is a fear of generating cracks. If the cracks generate, impurities generated from graphite base material etc. of the cracks drop and contaminate into the melt to lower a degree of purity of the single crystal. Further, it generates particles to stick on the single crystal, which causes a problem of first dislocation generation and considerably lowers productivity on pulling the single crystal.

In order to solve such problems, it has been proposed to improve the strength by increasing the thickness of the radiation shield. However, because it causes increasing dead weight of the radiation shield, it becomes high price, and is not desirable. In addition, heat capacity of the radiation shield also becomes large, which leads to the result contrary to the effect of shielding heat radiation.

Further, as shown in FIG. 1 and described in left column of page 3 of Japanese Patent Laid-open No. 5-884, a single crystallizing apparatus is described, in which most surfaces are curved on an outer wall of a prior conical rectifier tube (radiation shield). Further in the single crystallizing apparatus, a number of vanes rise for avoiding turbulent flow in order to obtain a semiconductor single crystal in good quality. However, the conical rectifier tube described in Japanese Patent Laid-open No.5-884 has a cylinder rising vertically and at acute angles from a bottom of the conical rectifier tube so as to surround single crystal. Therefore, if the surface of the conical rectifier tube of graphite material is coated with silicon carbide, because of the difference of material characteristics between the graphite base material and the silicon carbide film, heat stress between both materials causes compression and expansion. If it exceeds strength characteristic of graphite base material, there is a fear of generating cracks. Further, because the cylinder rises vertically and at acute angle, a horizontal part cannot be formed for a heat insulator improving heat-insulating property.

Further, as shown in FIG. 2 and described in right column of page 3, and paragraph No. 0017-0019 of Japanese Patent Laid-open No. 2000-119089, a radiation shield comprises a conical part, a horizontal part, a drum part, and a heat insulating material. The conical part comprises an inner face of the radiation shield and has a reverse-frustum shape and an opening for penetrating a single crystal. The horizontal part communicates with a bottom of the conical part, extends radially horizontally from the bottom of the conical part, and opposes to the surface of the melt. The drum part has a cylindrical shape, opposes to an inner surface of a quartz glass crucible, and extends vertically. The heat insulating material is filled in a hollow part bounded by the drum part, the conical part, and the horizontal part. Further, at a communicating part between the horizontal part and the drum part, a round corner, for example a circular arc part, is formed so as to reduce a diameter toward a centerline of the single crystal. Further, it is provided with ring, brimmed, or flanged rims, which extend from respective upper ends of the conical part and the drum part radially, horizontally, and outwardly. The hollow part for filling the heat insulating material is also bounded by a cylindrical support extending downward from the ring rims. However, in Japanese Patent Laid-open No.2000-119089, because the heat insulating material is embedded in advance in the radiation shield, it is difficult to adjust the amount of the heat insulating material depending on use for adjusting a temperature zone. Further, it is hard to improve the ratio of single crystallization.

Further, because the radiation shield increases in weight, workability decreases. Further, weight on an upper end thereof easily generates cracks, and the cost of the radiation shield becomes high.

SUMMARY OF THE INVENTION

This invention has an object to provide an apparatus for pulling a single crystal, which can improve the ratio of single crystallization, even if the radiation shield is made of graphite base material and covered with silicon carbide. The apparatus can be manufactured by low cost and can improve heat insulating characteristic. The apparatus does not generate cracks by heat stress even in a large size.

To achieve the object above, one embodiment of the present invention provides an apparatus for pulling a single crystal comprising a chamber means, a crucible located in the chamber means, a heater for heating a material provided in the crucible so that the material is melt, a radiation shield located in the chamber means so as to surround a region in which a single crystal is pulled, for regulating flow of inert gas introduced therein, wherein a seed crystal is immersed into the melt material to pull the single crystal, the radiation shield being made of graphite base material coated with silicon carbide, the radiation shield comprising a main shield body, a horizontal part, and a rising part, the main shield body being located so as to surround the single crystal and being formed of a hollow pipe, the horizontal part extending inward and substantially horizontally relative to a surface of the melt material from the main shield body and being formed of a ring shape, wherein the rising part rises upward along the single crystal and is formed of a ring shape, a first curvature formed between the main shield body and the horizontal part, a second curvature formed between the horizontal part and the rising part, and wherein each of the first curvature and the second curvature has an inside corner with a curved surface. Thus, even in a radiation shield made of graphite base material and covered with silicon carbide, the apparatus, which can improve the ratio of single crystallization and can be manufactured by low cost, will be realized. Further, the apparatus according to the invention does not generate stress by the difference of a heat expansion coefficient between graphite and silicon carbide. Further, the apparatus generates no crack by heat stress even in a large size.

Further, in a preferred embodiment, a mounting part extends outward from an upper end of the main shield body, the mounting part being formed of a ring shape, and wherein a third curvature with a curved surface is formed between the main shield body and the mounting part.

Further, in another preferred embodiment, each curved surface is formed of a circular arc or an elliptic arc in cross section, and wherein the curved surface has a radius of curvature of 5 mm or more.

Further, in another preferred embodiment, a heat insulating material with a ring shape is supported by the main shield body, the horizontal part, and the rising part. This results in easily supporting the heat insulating material, easily increasing the thickness of the heat insulating material, increasing heat insulating characteristic, and avoiding dropping particles or fragments on the melt even if they originate from the heat insulating material.

Further, in another preferred embodiment, a cover is provided for covering the heat insulating material, the cover being constructed dividable into a plurality of rings having different heat conductivities. Thus, by combining the ring members, the temperature range can be easily adjusted, which improves the ratio of single crystallization.

Further, in another preferred embodiment, the main shield body and the horizontal part are arranged substantially in an obtuse angle, and the horizontal part and the rising part are arranged substantially in a right angle.

DESCRIPTION OF THE PREFERRED EMBODIMENT

Now a first embodiment of an apparatus for pulling a single crystal according to the invention will be explained referring to the attached drawings.

Figure 1:
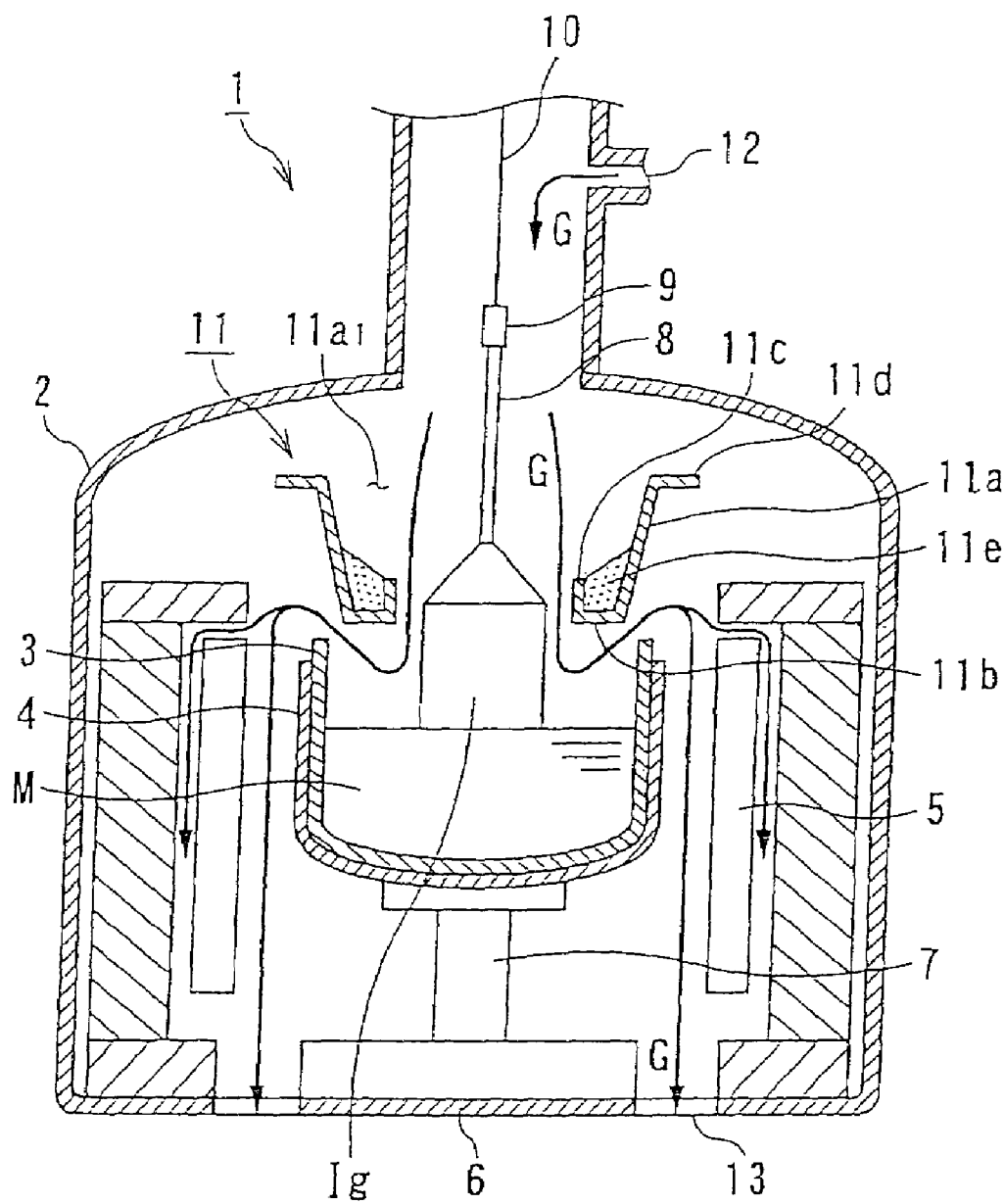
FIG. 1 is a schematic view of a first embodiment of the apparatus for pulling the single crystal according to the invention.

FIG. 1 is a schematic view of the apparatus for pulling the single crystal according to the invention.

As shown in FIG. 1, an apparatus 1 for pulling the single crystal according to the present invention comprises a chamber means 2, a quartz glass crucible 3, a graphite crucible 4, a heater 5, and a rotary shaft 7. The quartz glass crucible 3 is arranged in the chamber means 2 for filling an semiconductor material. The graphite crucible 4 supports the quartz glass crucible 3. The heater 5 surrounds the graphite crucible 4 and heats the semiconductor material in the quartz glass crucible 3 to turn it into the melt M. The rotary shaft 7 penetrates a bottom 6 of the chamber means 2. The rotary shaft 7 is attached to the graphite crucible 4. A motor (not shown) is connected with the rotary shaft 7 to rotate. An elevating means (not shown) is provided for raising or falling the rotary shaft 7.

Further, in the apparatus 1, a pulling wire 10 is provided at an upper part of the quartz glass crucible 3. The pulling wire 10 has a seed chuck 9 for holding a seed 8 that is used for pulling the single crystal. The pulling wire 10 is driven by the motor that is not shown in the figure, and attached to a wire-rotating device in a woundable or releasable manner.

Further, it comprises a radiation shield 11 arranged so as to surround a pulling zone above the quartz glass crucible 3 to control flow of inert gas G and provided with an opening $11a_1$. A single crystal Ig penetrates the opening $11a_1$. Further, at an upper part of the chamber means 2, an opening 12 is provided for supplying inert gas, while at a bottom 6 of the chamber means 2, openings 13 are provided for discharging inert gas.

Figure 2:
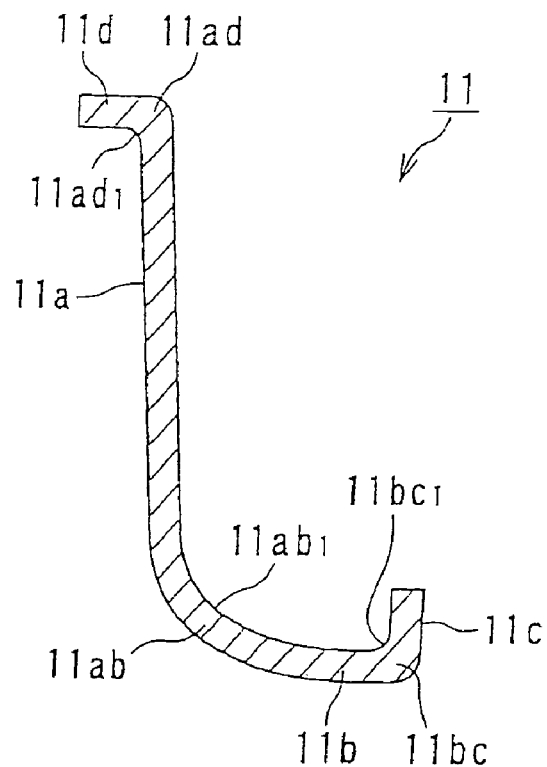
FIG. 2 is a schematic view of one part of the radiation shield used for the first embodiment of the apparatus for pulling the single crystal according to the invention.

As shown in FIG. 2, the radiation shield 11 is made of graphite material with small heat conductivity and with a good heat insulating property. A surface of the radiation shield 11 is coated with silicon carbide to maintain the clean atmosphere.

Figure 6:
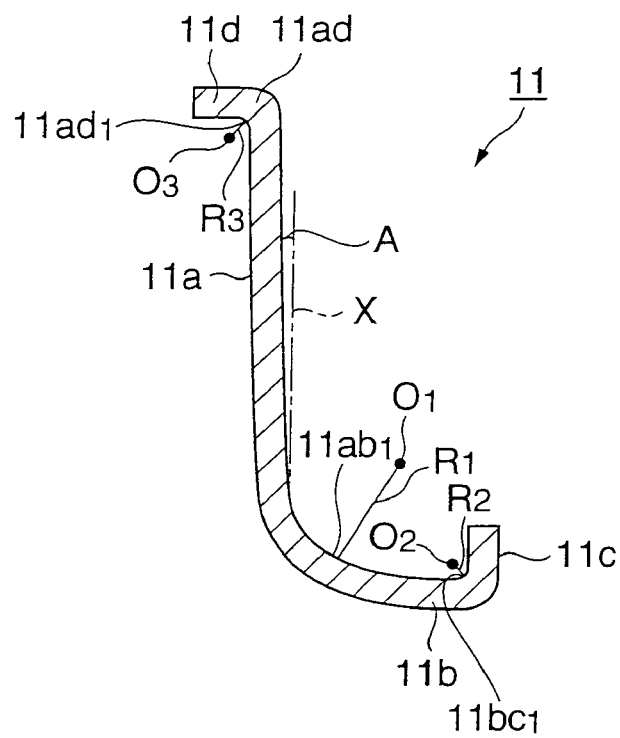
FIG. 6 is a schematic view of one part of the radiation shield used for the first embodiment of the apparatus for pulling the single crystal according to the invention.

The radiation shield 11 has a main shield body 11a, a horizontal part 11b, a rising part 11c, and a mounting part 11d. The main shield body 11a has a hollow pipe shape, for example a hollow frustum shape, and has the opening $11a_1$ arranged so as to surround single crystal Ig. The horizontal part 11b has a ring shape and extends inward and substantially horizontally from the main shield body 11a. The rising part 11c has a ring shape and rises upward from the horizontal part 11b along the single crystal. The mounting part 11d has a ring shape and extends outward from the main shield body 11a. Although the main shield body 11a in this embodiment is tilted by an angle A from a vertical line X as shown in FIG. 6, the angle A is not limited to the one shown in FIG. 6. For example, the main shield body 11a can be formed of a pipe, tube, cone, cylinder, or other shapes. The horizontal part 11b can be formed in a flat face or a curved face.

The horizontal part 11b is communicated with the main shield body 11a via a curvature 11b (first curvature). The rising part 11c is communicated with the horizontal part 11b via a curvature 11bc (second curvature). Further, the mounting part 11d is communicated with the main shield body 11a via a curvature 11ad (third curvature). Here, each of an inside corner $11bc_1$ of the curvature $11_{bc}$ and an inside corner $11ad_1$ of the curvature 11ad is formed of a curved surface having for example a circular arc-cross section. Each distance ($R_2$, $R_3$) from the center ($O_2$, $O_3$), namely each radius of curvature, is 5 mm or more (see FIG. 6). Further, the curvature 11ab is formed of a curved surface having an elliptic arc-cross section. An inside corner $11ab_1$ is also formed of a curved face having an elliptic arc-cross section. A radius ($R_1$) from the center ($O_1$) is 100 mm or more, 150 mm for example (see FIG. 6). If each distance or radius ($R_1$, $R_2$) from the center ($O_2$, $O_3$) is set to 5 mm or more, stress does not occur and cracks do not appear due to a difference of a heat expansion coefficient between graphite and silicon carbide. If each distance or radius ($R_2$, $R_3$) is smaller than 5 mm, stress occurs by the difference of the heat expansion coefficient of graphite and silicon carbide and cracks appear. In addition, if necessary, a curved surface with R 5 mm or more can be formed at an outside corner of each curvature and the end of the base material.

Figure 3:
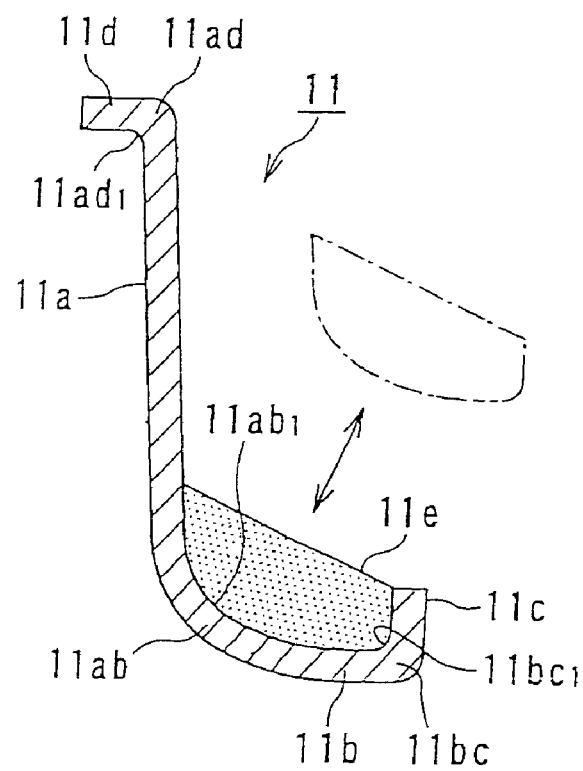
FIG. 3 is a schematic view of one part of the radiation shield used for the first embodiment of the apparatus for pulling the single crystal according to the invention.

As shown in FIG. 3, on the horizontal part 11b of the radiation shield 11, a heat insulating material 11e with a ring shape is mounted, supported by the rising part 11c, and attached easily and removably. Because the heat insulating material 11e is supported by the rising part 11c, the thickness of the heat insulating material 11e can be easily increased. In addition, heat insulating characteristic can be improved. Further, even if particles or fragments originate from the heat insulating material 11e, the rising part 11c prevents them from dropping on the melt M.

The heat insulating material 11e is coated with silicon carbide. Therefore, even if a cover is not provided for preventing particles generated from the heat insulating materials, it can prevent particles from dropping. The constitution can also be simplified.

Next will be explained a method for pulling the single crystal by means of the apparatus according to the invention.

As shown in FIG. 1, the material poly-silicon is filled in the quartz or silica glass crucible 3. Inert gas G flows from the opening 12 into the chamber means 2. The heater 5 is exerted to heat the silica glass crucible 3. The motor for rotating the crucible is exerted to rotate the silica glass crucible 3 by means of the rotary shaft 7 connected with the motor.

After a certain time passed, the wire-rotating device is rotated for lifting down the pulling wire 10. The seed chuck 9 is lowered. The seed 8 is made contact with the silicon melt M. The crystal grows and the single crystal Ig is pulled.

In this process of pulling the silicon single crystal, inert gas G supplied from the opening 12 is well regulated by means of the rising part 11c, and it passes between the radiation shield 11 and the single crystal Ig. Heat from the surface of the melt to the single crystal Ig is shielded by the horizontal part 11b. Inert gas G reaches the surface, of the melt M. Oxides evaporated from the surface of the melt M are caught in inert gas G. Inert gas G containing oxides passes between the outside of the radiation shield 11 and the silica glass crucible 3, and it is discharged from the openings 13 to the outside of the chamber means 2.

Figure 4:
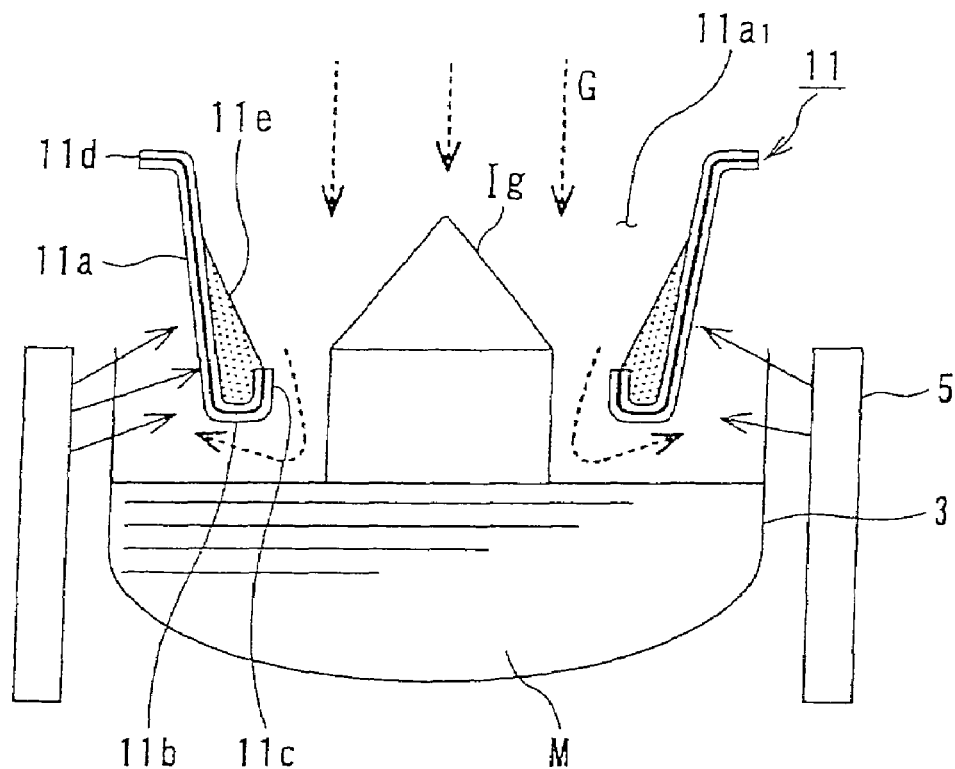
FIG. 4 is a schematic view of operation of the radiation shield of the first embodiment of the apparatus for pulling the single crystal according to the invention.

Further, in the process of pulling the silicon single crystal, as shown in FIG. 3 and FIG. 4, the radiation shield 11 shields radiation heat on the silicon single crystal Ig from the heater 5 and the melt M, which promotes cooling the silicon single crystal Ig. Thus, a desired temperature gradient is obtained, which is necessary for pulling the silicon single crystal Ig. Further, although the radiation shield 11 is exposed in high temperature, which makes itself high temperature, the inside corner $11bc_1$ of the curvature 11bc and the inside corner $11ad_1$ of the curvature $11_{ad}$ of the radiation shield 11 are formed of circular arcs with each radius of curvatures ($R_2$, $R_3$) being 5 mm or more, and the curvature ab including the inside corner $11ab_1$ is formed of a curved surface with the elliptic arc, where the distance ($R_1$) from the center ($O_1$) thereof is 100 mm or more, 150 mm for example. Therefore, heat stress generated in the radiation shield 11 is dispersed by the difference of the material characteristics between the graphite base material and the silicon carbide film, which can avoid generating cracks by compression and expansion. Thus, strength of the radiation shield can be increased without increasing the thickness of the base material of the radiation shield 11.

Further, because one of the curvatures is formed of the curved surface with elliptic arc, flow of inert gas G can be smoothed. Inert gas G including oxides can be discharged from the outlet 13 to the outside of the chamber means 2. A silicon single crystal with a low oxygen-concentration can be pulled.

Next, a second embodiment of the apparatus for pulling the single crystal according to the invention will be explained.

The second embodiment relates to an apparatus with a cover for covering the heat insulating material in the first embodiment.

Figure 5:
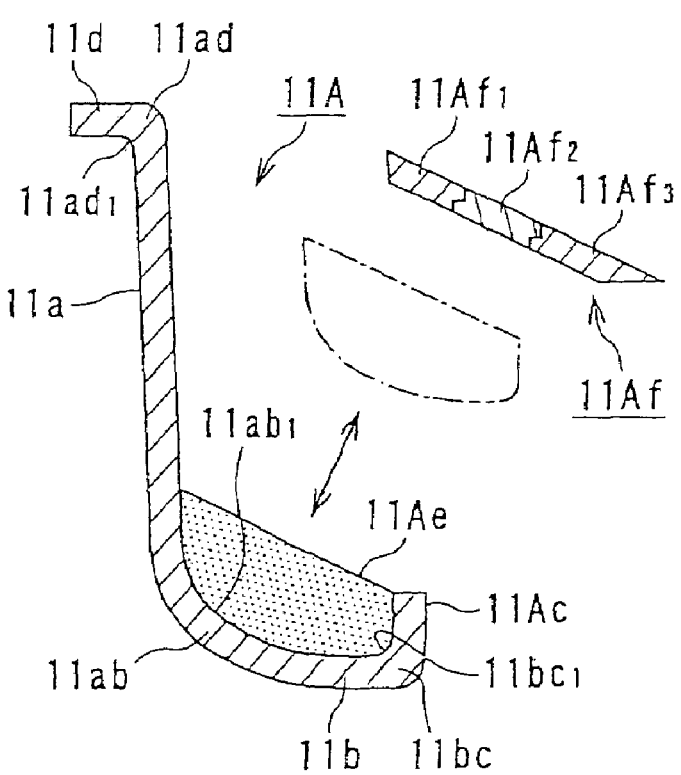
FIG. 5 is a schematic view of one part of a second embodiment of the apparatus for pulling the single crystal according to the invention.

For example, as shown in FIG. 5, the radiation shield 11A is provided with a cover 11Af for covering a heat insulating material 11Ae. The cover 11Af comprises a plurality of dividable ring members $11Af_1$, $11Af_2$, and $11Af_3$, which are made of materials with different heat conductivities, such as graphite, quartz glass, molybdenum, etc. Although it is preferable to cover the heat insulating material 11Ae with silicon carbide, it is not necessarily to be covered with silicon carbide, because it is covered with the cover 11Af. In addition, because the other constitutions are not different from the radiation shield in FIG. 3, explanation is omitted by marking the same reference numerals.

Thus, by appropriately combining the ring members $11Af_1$, $11Af_2$, and $11Af_3$, the temperature range 1050~1150° C. in which COP (Crystal Oriainated Particle) density is influenced can be easily adjusted. The ratio of single crystallization can be improved. Further, even if particles or fragments originate from the heat insulating material 11Ae, the rising part 11Ac and the cover 11Af prevent them from dropping on the melt.

Figure 7:
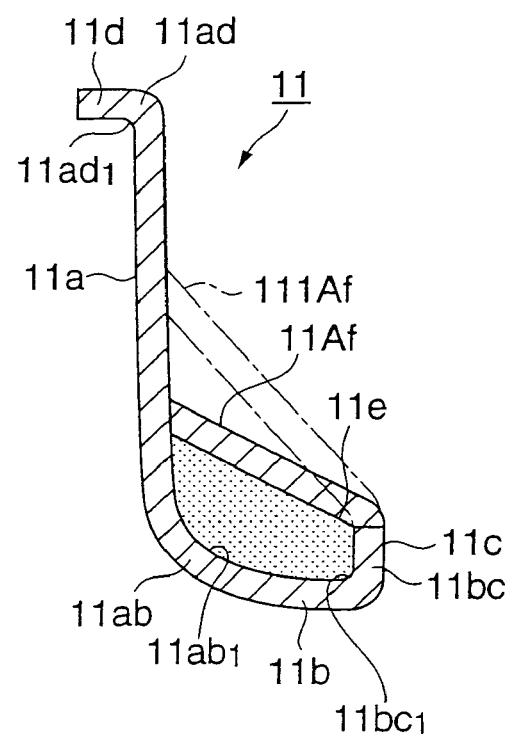
FIG. 7 is a schematic view of one part of the radiation shield used for the second embodiment of the apparatus for pulling the single crystal according to the invention.
Figure 8:
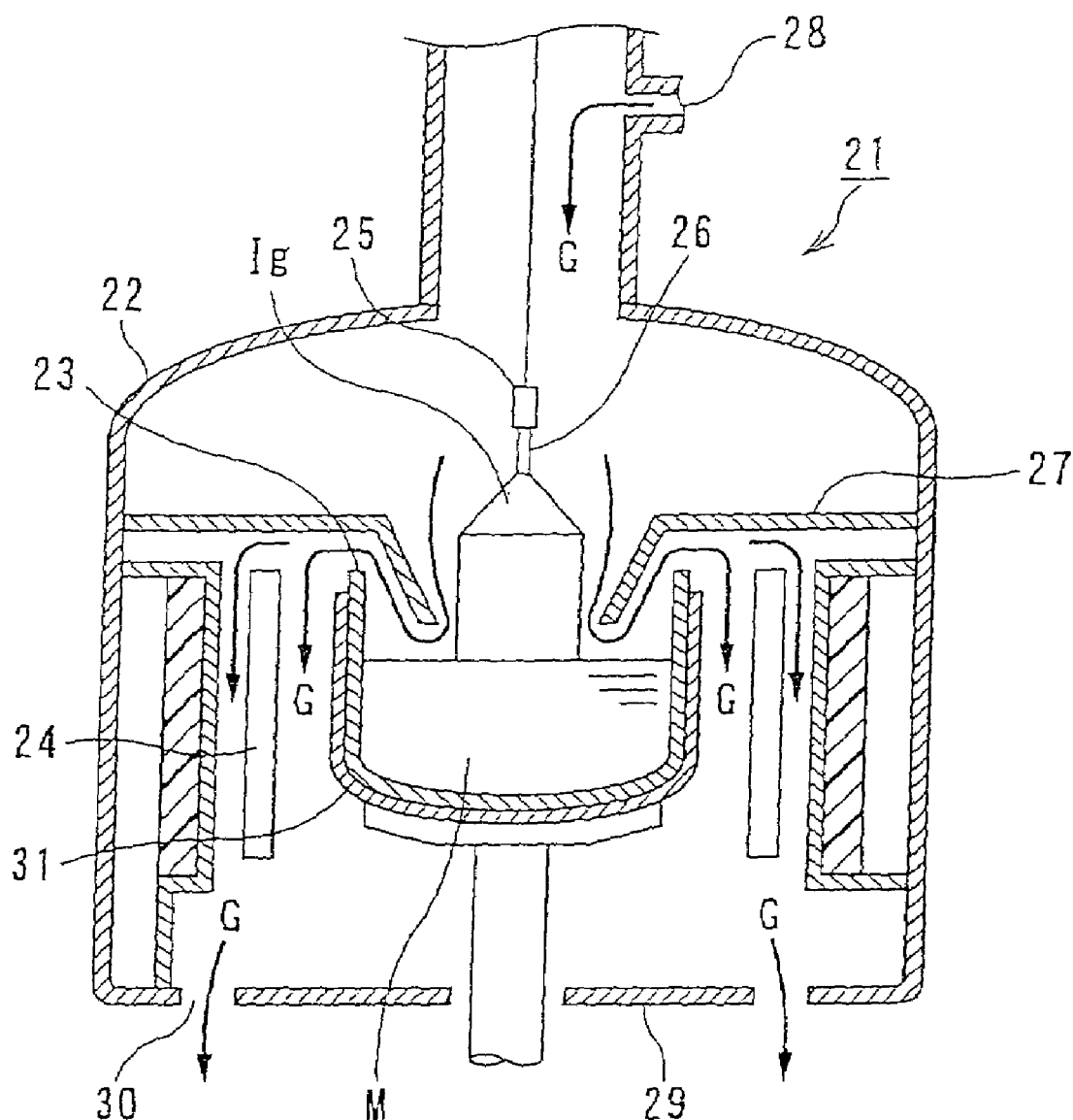
FIG. 8 is a schematic view of a conventional apparatus for pulling a single crystal.

Further, a cover 111Af corresponding to a shape of a thick heat insulating material can be mounted thereon (see FIG. 7). The cover 111Af can be constituted of the same function as the cover 11Af.

EXAMPLE

Object: 1. The silicon single crystal was pulled by means of the apparatus according to the invention (example), which includes the radiation shield described below. The result was compared to the prior art (conventional apparatus).

2. The difference of heat stress was examined by thermal rating from the difference of shapes between the example and conventional apparatus.

Radiation shield: a frustum of a circular cone, in which a graphite mold was used as a base material and covered by silicon carbide, thickness was about 10 mm, an inside corner R was 5 mm (R is 1 mm in the prior art), an inside corner R between the main shield body and the horizontal part was 20 mm, φ700 mm in outer diameter, φ350 mm in inner diameter, and 500 mm in height.

Result: 1 In the conventional apparatus (the inside corner R is 1 mm), cracks generated at the inside corner between the horizontal part and the rising part. On the other hand, no crack was observed in the example.

2 The result of measured heat stress is shown in Table 1.

TABLE 1

| | inside corner (mm) | Stress of silicon carbide film (kgf/mm$^2$) | Stress of graphite base material (kgf/mm$^2$) |
|---|---|---|---|
| example | 5 | 10 | 1.0 |
| conventional apparatus | 1 | 13 | 1.2 |

As can be understood from Table 1, it was confirmed that heat stress generated at the graphite base material and the silicon carbide film can be dispersed in the ratio of about 20%.

In the apparatus for pulling the single crystal according to the invention, it can improve the ratio of single crystallization, even if the radiation shield is made of graphite base material and covered with silicon carbide. The apparatus can be manufactured by low cost and can improve heat insulating characteristic. The apparatus does not generate cracks by heat stress even in a large size.

What is claimed is:

1. An apparatus for pulling a single crystal comprising
a chamber,
a crucible located in the chamber,
a heater for heating a material provided in the crucible so that the material is melted,
a radiation shield arranged in the chamber so as to surround a region in which a single crystal is pulled, for regulating flow of inert gas introduced therein, wherein a seed crystal is immersed into the melted material to pull the single crystal,
the radiation shield comprises a graphite based material coated with silicon carbide,
the radiation shield comprising a main shield body, a horizontal part, and a rising part,
the main shield body being arranged so as to surround the single crystal and comprising a hollow pipe shape,
the horizontal part extending inward and substantially horizontally, relative to a surface of the melt material, from the main shield body and comprising a ring shape,
wherein the rising part rises upward along the single crystal and comprises a ring shape,
a first curvature formed between the main shield body and the horizontal part,
a second curvature formed between the horizontal part and the rising part,
wherein each of the first curvature and the second curvature comprises an inside corner with a curved surface,
a mounting part extending outward from an upper end of the main shield body, the mounting part comprises a ring shape, and
a third curvature with a curved surface, which is formed between the main shield body and the mounting part,
wherein each curved surface of the first, second and third curvatures is formed of a circular arc or an elliptic arc in cross section, and has a radius of curvature of 5 mm or more.

2. An apparatus according to claim 1, further comprising a heat insulating material with a ring shape which is supported by the main shield body, the horizontal part, and the rising part.

3. An apparatus according to claim 2, further comprising a cover provided for covering the heat insulating material, the cover being constructed dividable into a plurality of rings having different heat conductivities.

4. An apparatus according to claim 1, wherein the main shield body and the horizontal part are arranged substantially in an obtuse angle, and the horizontal part and the rising part are arranged substantially in a right angle.

5. An apparatus according to claim 2, wherein the main shield body and the horizontal part are arranged substantially in an obtuse angle, and the horizontal part and the rising part are arranged substantially in a right angle.

6. An apparatus according to claim 3, wherein the main shield body and the horizontal part are arranged substantially in an obtuse angle, and the horizontal part and the rising part are arranged substantially in a right angle.

7. A radiation shield for a single crystal pulling apparatus comprising:
a main shield body comprising a hollow pipe shape;
a horizontal part extending inwardly from the main shield body and substantially perpendicularly with respect to a longitudinal axis through the main shield body;
a rising part which rises from the horizontal part at a point on the horizontal part that is distal from the main shield body;
a first curvature formed between the main shield body and the horizontal part; and
a second curvature formed between the horizontal part and the rising part;

wherein each of the first curvature and the second curvature is formed of an arc (i) comprising a circular or elliptic cross section and (ii) comprising a radius of curvature of 5 mm or more; and wherein the radiation shield comprises a graphite based material and a silicon carbide coating on the graphite based material; and further comprising a mounting part extending outwardly from an upper end of the main shield body and a third curvature formed between the main shield body and the mounting part.

8. A radiation shield according to claim 7, further comprising a heat insulating material supported by the main shield body, the horizontal part and the rising part.

9. A radiation shield according to claim 7, further comprising a cover for covering the heat insulating material, the cover being dividable into a plurality of rings having different heat conductivities.

10. A radiation shield according to claim 7, wherein the main shield body and the horizontal part are arranged at a substantially obtuse angle relative to one another, and the horizontal part and the rising part are arranged at a substantially right angle relative to one another.

11. A radiation shield according to claim 7, wherein the main shield body comprises a frustum shape.

12. A single crystal pulling apparatus comprising a radiation shield according to claim 7.

* * * * *